(12) United States Patent
Coenen

(10) Patent No.: US 8,030,941 B2
(45) Date of Patent: Oct. 4, 2011

(54) SYSTEM AND METHOD FOR MEASURING FUEL CELL VOLTAGE

(75) Inventor: Peter Coenen, Glabbeek (BE)

(73) Assignee: Vlaamse Instelling Voor Technologisch Onderzoek (Vito), Mol (BE)

( * ) Notice: Subject to any disclaimer, the term of this patent is extended or adjusted under 35 U.S.C. 154(b) by 735 days.

(21) Appl. No.: 11/720,509

(22) PCT Filed: Nov. 29, 2005

(86) PCT No.: PCT/BE2005/000176
§ 371 (c)(1),
(2), (4) Date: Apr. 28, 2008

(87) PCT Pub. No.: WO2006/058394
PCT Pub. Date: Jun. 8, 2006

(65) Prior Publication Data
US 2008/0191702 A1    Aug. 14, 2008

(30) Foreign Application Priority Data
Nov. 30, 2004   (EP) .................................. 04447265

(51) Int. Cl.
*G01N 27/416* (2006.01)
*H02J 7/00* (2006.01)

(52) U.S. Cl. ...................... 324/434; 320/116
(58) Field of Classification Search .............. 324/434; 320/116
See application file for complete search history.

(56) References Cited

U.S. PATENT DOCUMENTS

| | | | | |
|---|---|---|---|---|
| 5,686,815 A | * | 11/1997 | Reipur et al. | 320/116 |
| 5,798,725 A | * | 8/1998 | Okada | 341/158 |
| 5,952,815 A | * | 9/1999 | Rouillard et al. | 320/116 |
| 6,020,717 A | * | 2/2000 | Kadouchi et al. | 320/116 |
| 6,064,053 A | | 5/2000 | Chi | |
| 6,281,684 B1 | | 8/2001 | James | |
| 6,411,097 B1 | * | 6/2002 | Ashtiani et al. | 324/434 |

FOREIGN PATENT DOCUMENTS

| | | |
|---|---|---|
| EP | 1 265 076 A1 | 12/2002 |
| JP | 2002-42906 | 2/2002 |

\* cited by examiner

*Primary Examiner* — M'Baye Diao
(74) *Attorney, Agent, or Firm* — Merchant & Gould P.C.

(57) ABSTRACT

A system for measuring individual cell voltages of a fuel cell stack includes a plurality of voltage scanning units (VSU). Each VSU is arranged for being connected to a group of cells, belonging to the fuel cell stack, the group of cells being provided with terminals that allow measuring a cell voltage. Each VSU comprises a filter/regulator that provides a voltage reference signal $V_{ref}$ that is applied to a first terminal of a first cell of the group of cells. The VSU further includes a multiplexer arranged for consecutively connecting the other terminals of the group of cells to a first input of an A/D converter, whereby the A/D converter is further provided with a second input for receiving the voltage reference signal $V_{ref}$. The ADC is further arranged for being fed with a supply voltage $V_{sup+}$ and for A/D converting a signal derived from the signals at the first and second input.

15 Claims, 4 Drawing Sheets

SYSTEM AND METHOD FOR MEASURING FUEL CELL VOLTAGE

FIELD OF THE INVENTION

The present invention is related to a device and method for measuring and evaluating individual cell voltages of a fuel cell stack.

STATE OF THE ART

A fuel cell is an electrochemical device that converts chemical energy produced by a reaction directly into electrical energy. For example, one type of fuel cell includes a proton exchange membrane (PEM), often called a polymer electrolyte membrane, permitting only protons to pass between an anode and a cathode of the fuel cell. At the anode, diatomic hydrogen (a fuel) is reacted to produce hydrogen protons that pass through the PEM. The electrons produced by this reaction travel through circuitry that is external to the fuel cell to form an electrical current.

Because a single fuel cell typically produces a relatively small voltage (around 1 Volt, for example), several fuel cells may be formed out of an arrangement called a fuel cell stack to produce a higher voltage. The fuel cell stack may include plates (e.g. graphite composites or metal plates) that are stacked one on top of the other, and each plate may be associated with more than one fuel cell of the stack. The plates may include various channels and orifices, for example to route the reactants and products through the fuel cell stack. Several PEMs (each one being associated with a particular fuel cell) may be dispersed throughout the stack between the anodes and cathodes of the different fuel cells.

The health of a fuel cell stack may be determined by monitoring the individual differential terminal voltages (i.e. cell voltages) of the fuel cells. In this manner a particular cell voltage may vary under load conditions and cell health over a range from −1V to +1V. The fuel cell stack typically may include a large number of fuel cells, and thus, common mode voltages (voltages with respect to a common voltage (ground)) of the fuel cells terminals may be quite large (i.e., some of the voltages of the terminals may be as high as 100 Volt, for example). Unfortunately, semiconductor devices that may be used to measure the cell voltages typically are incapable of receiving high common mode voltages (voltages over approximately 18V, for example). One solution may be to use resistor dividers to scale down the terminal voltages. However, the process of scaling down reduces the measurement accuracy and moreover the resistor tolerances may introduce measurement errors.

Prior art document U.S. Pat. No. 6,281,684-B proposes a cell voltage measurement system comprising a plurality of voltage scanning units, each being associated with a group of cells of a fuel cell stack. The scanning units may have ground references at potentials greater than a ground reference of the fuel cell stack. However, under certain conditions negative cell voltages may occur, that are potentially dangerous for fuel cells. The disclosed cell voltage measurement system only provides protection against this situation by using expensive circuits capable of digitising both positive and negative voltages. Document U.S. Pat. No. 6,281,684-B further discloses the use of control lines to select one cell at a time for measurement by means of two analogue multiplexers, which may be shifted over one cell with respect to one another (i.e. input terminal D0 in the first multiplexer is connected to input D1 in the second). One multiplexer is used to shift a reference and the other one to shift the signal to be measured. When considered at system level, for each measurement a different reference voltage is applied. This yields not only an expensive solution, but also requires the proper programming of a processor.

Aims of the Invention

The present invention aims to provide a system and method for measuring individual fuel cell voltages, that allows the use of semiconductor devices and wherein also negative cell voltages can be measured.

SUMMARY OF THE INVENTION

The present invention relates to a system for measuring individual cell voltages of a fuel cell stack, said system comprising a plurality of voltage scanning units (VSU). Each VSU is arranged for being connected to a group of cells, belonging to the fuel cell stack, said group of cells being provided with terminals that allow measuring a cell voltage. Each VSU comprises a filter/regulator providing a voltage reference signal $V_{ref}$, said voltage reference signal being applied to a first terminal of a first cell of the group of cells. The VSU further comprises
an A/D converter, said A/D converter arranged for being fed with a supply voltage $V_{sup+}$ and for receiving at a first input the voltage reference signal $V_{ref}$, and
a multiplexer arranged for consecutively connecting the other terminals of the group of cells to a second input of the A/D converter.

Preferably the voltage reference signal $V_{ref}$ is smaller than $V_{sup+}$ in absolute value.

In a preferred embodiment the system for measuring individual cell voltages further comprises a main controller being connected to at least one VSU of the plurality of VSUs.

In another embodiment each VSU comprises a protocol driver comprising a unique identification for the VSU. Advantageously the protocol driver is arranged for communicating with said main controller. The VSU may further comprise optocouplers.

Preferably the supply voltage $V_{sup+}$ is drawn from an AC power bus, connected via capacitive coupling to the filter/regulator.

In an advantageous embodiment each group of cells consists of four cells.

In another object the invention relates to a method for measuring individual cell voltages of a group of cells belonging to a fuel cell stack, said group of cells being provided with terminals. The method comprises the steps of
connecting a voltage scanning unit (VSU) to the group of cells,
providing a voltage reference signal to a first terminal of a first cell of the group of cells,
applying the voltage reference signal to a first input of an A/D converter, said A/D converter being comprised in the VSU and being fed by a supply voltage $V_{sup+}$,
connecting consecutively a voltage signal from the other terminals of the group of cells to be measured to a second input of the A/D converter.

In an alternative embodiment the method further comprises the steps of, in case a measured cell voltage signal exceeds a predetermined threshold, calculating the minimum, average and maximum voltage of the fuel cell stack and perform a correcting action based on the calculated minimum, average and maximum voltage.

SHORT DESCRIPTION OF THE DRAWINGS

DETAILED DESCRIPTION OF THE INVENTION

In the system according to the invention the fuel cell stack is partitioned into (non-overlapping) groups of fuel cells. The measuring circuit is referenced to the lowest voltage in the group. So, when referenced to the stack negative terminal, each fuel cell group has a different common mode voltage. In this way the common mode voltage for the measuring circuit never exceeds the maximum allowed for a semiconductor device to be used. By limiting the number of cells in a group, an adequate measurement resolution and accuracy can be maintained. The measuring circuit digitises the measured voltages and transmits them to a main controller. To measure all cell voltages in a fuel cell stack, several measuring circuits are required.

The system uses two main hardware components: the voltage scanning units and the main controller, which is a computer on which a specific software program is run. This computer drives the voltage scanning units, evaluates the data collected from them and retransmits the results of this evaluation. Using the same method, other sensors than those for voltage measurement can be connected to the main controller. The term voltage scanning unit (VSU) refers to a device capable of digitising one or more voltages, each voltage being associated to a different cell of the fuel cell stack. The main controller refers to a computer device capable of communicating with the VSUs and with other controllers used to control the fuel cell stack system.

Figure 1:
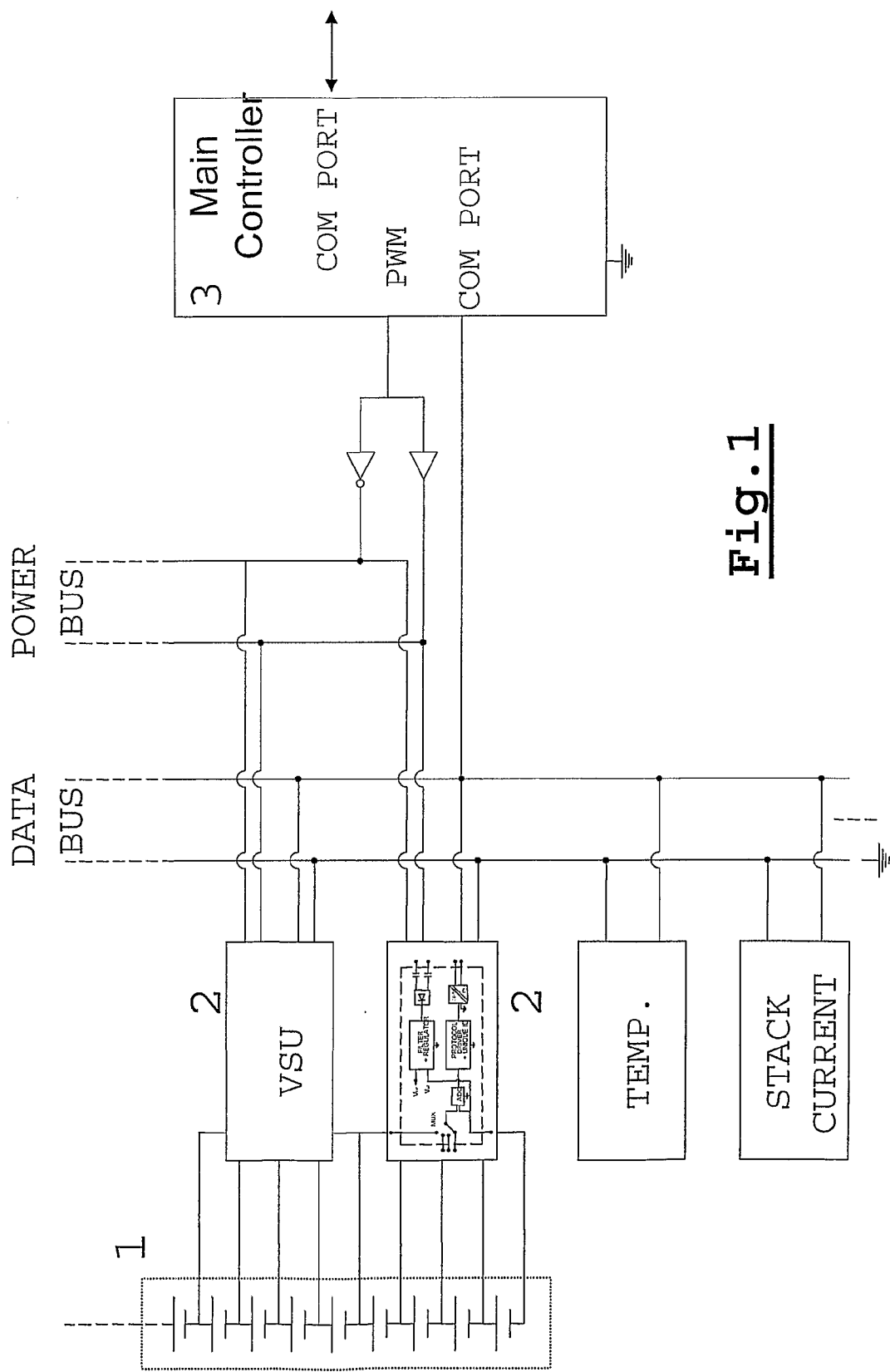
FIG. 1 represents the lay-out of the system according to the invention.

The fuel cell stack 1 is divided into groups of adjacent cells. Each cell of a single group is connected to the same VSU 2 (see FIG. 1). The terminal at the lowest voltage level in a group is connected to a positive reference voltage ($V_{ref}$), derived inside the VSU. More specifically, each VSU comprises a rectifier 26, filter and regulator 23 to be used as a regulated power supply for the measuring circuit and in which the $V_{ref}$ is derived using a precision voltage reference. The other terminals of the group of cells are then connected to the various inputs of a multiplexer device 21. The multiplexer routes the cell voltages to an analog-to-digital converter 22 (ADC). All VSUs are identical. $V_{ref}$ can be chosen to have the same value for all VSUs, which simplifies calculations according to equations 1a, 1b . . . If very high precision is required, $V_{ref}$ can be determined for each VSU individually, each VSU then has its own set of equations. This would require additional storage in the main controller.

Figure 2:
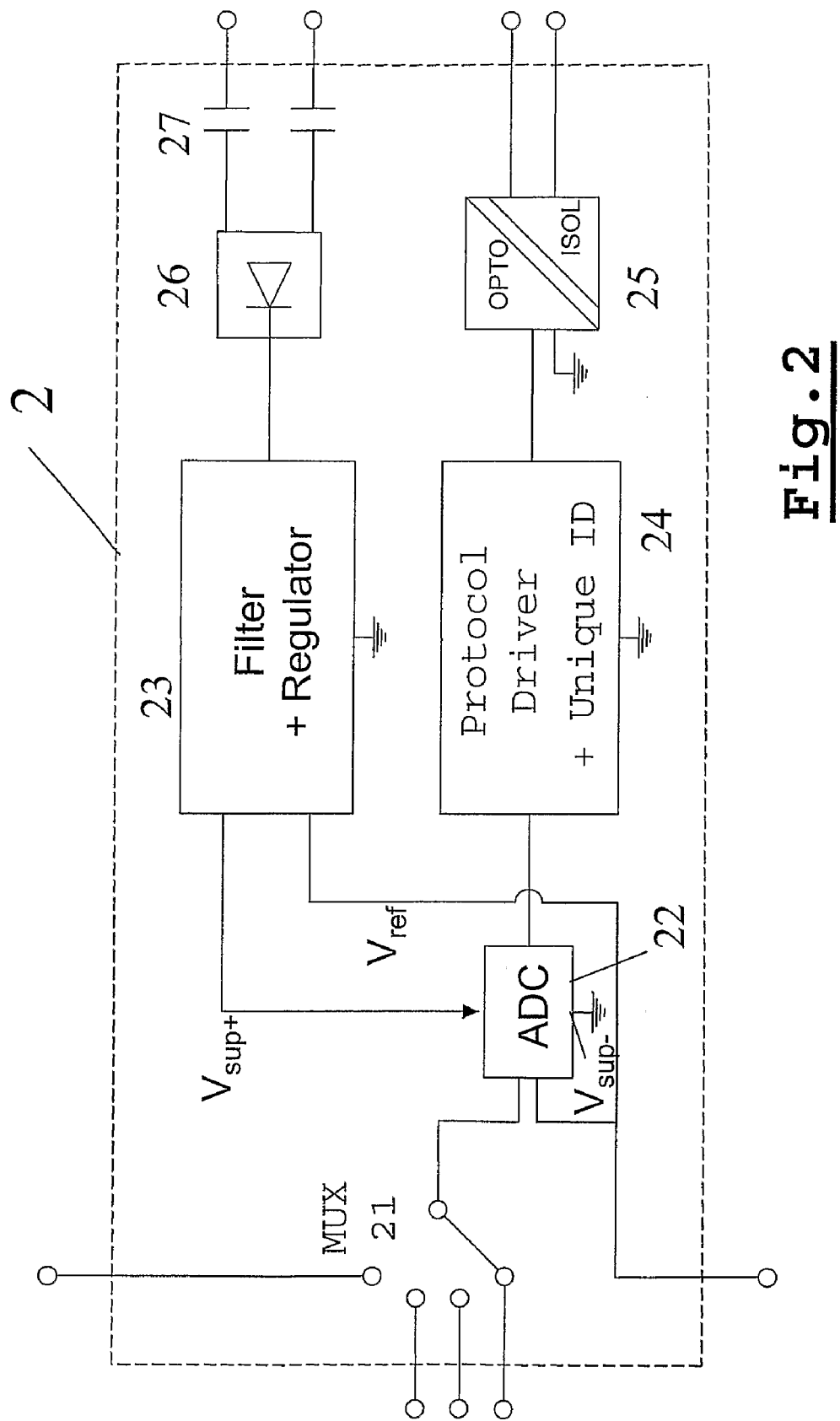
FIG. 2 represents more in detail a scheme of the voltage scanning unit shown in FIG. 1.

The positive reference voltage $V_{ref}$ inside the VSU is chosen to be higher than $V_{sup-}$, i.e. the negative power supply to the ADC (see FIG. 2), but lower than $V_{sup+}$. Typically $V_{sup-}$ is the ADC's ground. Because the voltage at the negative power supply terminal of the ADC also serves as the internal reference for all A/D conversions, the results of the different conversions in one ADC ($V_{ADC1}$, $V_{ADC2}$, $V_{ADC3}$, . . . ) can be written as a function of the different cell voltages ($V_{cell1}$, $V_{cell2}$, $V_{cell3}$, . . . ) and of $V_{ref}$:

$$V_{ADC1} = V_{ref} + V_{cell1} \quad \text{(equation 1a)}$$

$$V_{ADC2} = V_{ref} + V_{cell1} + V_{cell2} \quad \text{(equation 1b)}$$

$$V_{ADC3} = V_{ref} + V_{cell1} + V_{cell2} + V_{cell3} \quad \text{(equation 1c)}$$

. . .

The result of any conversion in one ADC ($V_{ADC1}$, $V_{ADC2}$, $V_{ADC3}$, . . . ) is a value between 0 and $V_{sup+}$. Applying this to equations 1, it can be seen that in a group of cells (cell1 or cell1+cell2 or cell1+cell2+cell3 . . . ) any voltage between $-V_{ref}$ and $V_{sup+} - V_{ref}$ can be measured.

As an example, a group may consist of four cells, the power supply $V_{sup+}$ to the ADC may be 5 Volt and the reference voltage $V_{ref}$ may be 1 Volt, so every channel of the ADC can measure a voltage between −1 Volt and 4 Volt. As this range must be shared by four cells, this allows measuring individual cell voltages between −0.25 Volt and 1 Volt. This shows a major advantage of the present invention, as negative cell voltages may occur under certain conditions.

Each VSU 2 contains a protocol driver 24 that can receive commands and transmit data to and from a main controller 3 over a data bus. Every protocol driver 24 in a VSU 2 contains a unique binary ID that allows individual addressing using only the data bus. The data bus at the main controller 3 and at the VSU 2 can have a different common mode voltage, so galvanic isolation is required. This is accomplished by using digital opto-couplers 25.

It is required to measure cell voltages during start-up and shut down, i.e. when the cell voltages can be very low, so power for the operation of the VSU 2 can not be derived from the fuel cells. Therefore the VSU draws its power from a power bus. The power bus carries a square wave alternating current power. The power consumption of the VSU is very low so it can be connected to the power bus with simple inductive or capacitive coupling (capacitors 27). The advantage of capacitive coupling is its lower price and weight compared to inductive coupling. Both coupling methods can ensure sufficient galvanic isolation to offset the common mode voltage.

The second main hardware component in the system is the main controller 3. The main controller has three tasks: communication with the VSUs, power bus control and interface to other fuel cell stack system controllers.

A single common data bus connects all VSUs 2 and the main controller 3. On this bus the main controller is the master, the VSUs are the slaves. The master initiates all communication either to all VSUs simultaneously or to one individual VSU by addressing it through the unique binary ID stored in the VSU. This eliminates the need for additional individual galvanically isolated connections between each VSU 2 and the main controller 3.

The main controller accesses the VSUs simultaneously for initialisation and for instructing them to perform an A/D conversion. The consequence is that all cell voltages are acquired at the same time. After the acquisition and the conversion, each VSU is accessed individually and sequentially in order to retrieve the results of the conversion. Once the results ($V_{ADC1}$, $V_{ADC2}$, . . . ) retrieved, the individual cell voltages ($V_{cell1}$, $V_{cell2}$, . . . ) can be calculated using the relationships described in equations 1a, 1b, 1c, etc . . . A data table in the main controller links the individual IDs of the VSUs to the position in the fuel cell stack of the cells connected to it.

As already mentioned, a single common power bus supplies power to all VSUs. A pulse width modulated (PWM) output of the main controller generates a signal that is used to alternatively connect each of the power lines to the positive or negative voltage of a dedicated DC power supply. The main controller measures the voltage of this power supply to allow setting ideal values of the PWM's frequency and duty cycle. An additional output of the main controller is used to disable the power line drivers in order to minimise power consumption.

For correct and reliable operation of a fuel cell stack, cell voltages should be within certain limits, depending on the operating conditions of the fuel cell stack. When one of the voltages exceeds the limits, one or more fuel cell stack system controllers (not shown in the figures) can take corrective actions. To define these actions, not all cell voltages are required: normally the minimum, the average and the maximum cell voltage suffice to define the actions (e.g. reducing the electric load or increasing the air flow rate or the hydrogen flow rate). A software routine in the main controller of the voltage monitoring system therefore calculates these values, identifies the cells associated with these minimum and maximum voltages and transmits this information to any other fuel cell stack system controller requiring it. Compared to transmitting all individual voltages, this substantially limits the bandwidth required for the communication and relieves the other system controllers of these tasks. The communication can be performed by any standard.

If a fuel cell stack contains a large number of cells and a high sampling rate is required, two or more data buses can be created. The VSUs are distributed evenly over the data busses and communication is performed simultaneously, thereby increasing bandwidth and sampling rate for each additional bus.

Figure 3:
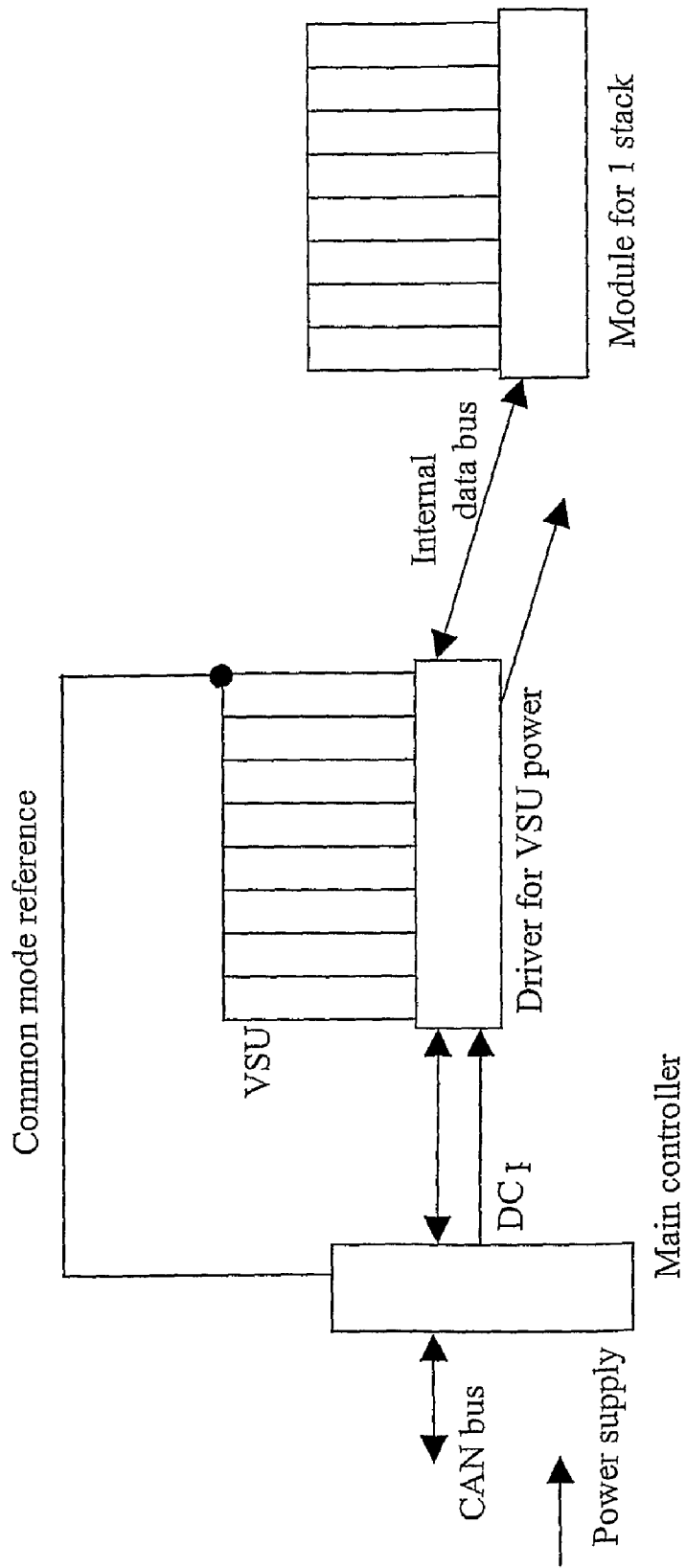
FIG. 3 represents a system with more than one fuel cell stack. It also shows the use of a common mode reference.

In a specific embodiment more than one fuel cell stack can be provided. As shown in FIG. 3 the various stacks can communicate with the main controller over the data bus and the VSUs in the stacks can be powered via the same power bus.

The system (with either one or more stacks of fuel cells) may advantageously be provided with means for monitoring the common mode voltage of a stack. Especially when the number of cells increases, it may be useful to bring the main controller to a voltage that is e.g. about half way between the highest and lowest voltage in the system. Such a connection is also shown in FIG. 3. For security reasons the current flowing in the connection between the stack and the main controller is to be monitored by said main controller, e.g. with a monitoring device as described in EP-1265076-A1. This requires thus some additional hardware that may be integrated into the main controller.

Figure 4:
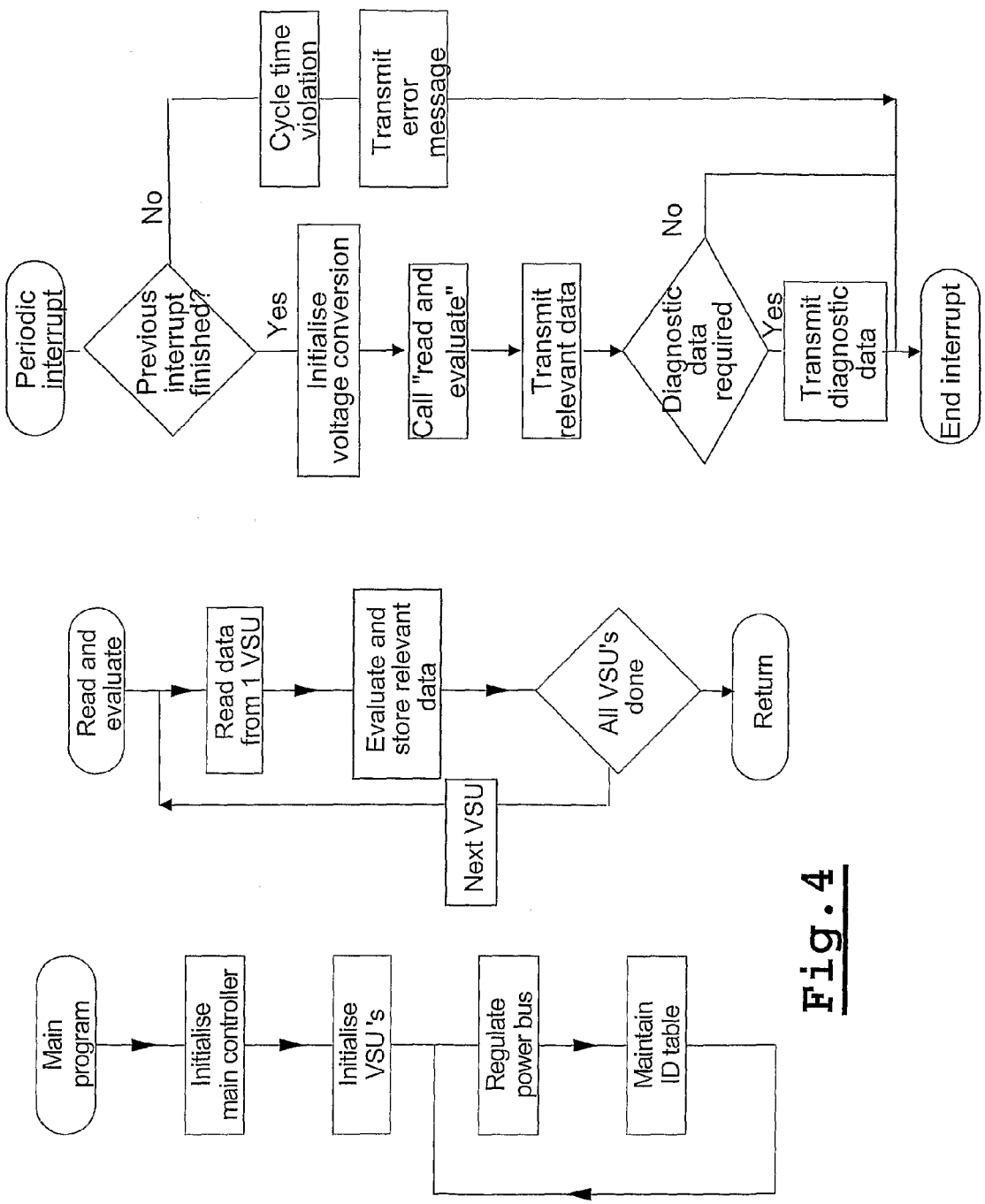
FIG. 4 represents a software flow chart.

The main controller of the cell voltage monitoring system contains software. The tasks performed by this software are (see also FIG. 4):
1. Initialisation of the main controller,
2. Maintenance of a table, called the ID table, identifying the VSUs with their individual ID and with their position within the fuel cell stack,
3. Initialisation of the VSUs,
4. Regulation of voltage, frequency and duty cycle on the power bus,
5. simultaneous initiation of voltage conversion,
6. individual reading of data stored in the VSUs,
7. evaluation of this data and transmission of relevant information to external devices,
8. reception of data packets from an external device in order to modify the ID table,
9. reception of data packets from an external device containing calibration data,
10. reception of data packets from an external device requesting diagnostic data,
11. transmission of diagnostic data; for example, but not limited to, all the cell voltages within one group.

To guarantee cyclic operation with a known cycle time, a timer in the main controller 3 generates an interrupt signaling the start of a measurement cycle. If not all VSUs are read before the next interrupt occurs, a cycle time violation occurs. This is an error situation in which normal operation is no longer guaranteed. Errors may occur during communication between main controller and VSUs. The software provides for retries and, if errors persist, for a means of signaling the problem to the other system controllers.

The invention claimed is:

1. A system for measuring individual cell voltages of a fuel cell stack, said system comprising a plurality of voltage scanning units (VSU), each VSU arranged for being connected to a group of cells, belonging to said fuel cell stack, said group of cells being provided with terminals providing for measuring a cell voltage,
wherein each VSU comprises a filter/regulator providing a voltage reference signal said voltage reference signal being applied to a first terminal of a first cell of said group of cells, said VSU further comprising a multiplexer arranged for consecutively connecting the other terminals of said group of cells to a first input of an analog to digital converter, said analog to digital converter further being provided with a second input for receiving said voltage reference signal, said analog to digital converter further arranged for being fed with a supply voltage and for analog to digital converting a signal derived from said signals at said first and said second input.

2. The system for measuring individual cell voltages as recited in claim 1, wherein said voltage reference signal is smaller than said supply voltage.

3. The system for measuring individual cell voltages as recited in claim 1, further comprising a main controller being connected to at least one VSU of said plurality of VSUs.

4. The system for measuring individual cell voltages as recited in claim 1, wherein each VSU comprises a protocol driver, said protocol driver comprising a unique identification for said VSU.

5. The system for measuring individual cell voltages as recited in claim 4, wherein said protocol driver is arranged for communicating with said main controller.

6. The system for measuring individual cell voltages as in claim 1, wherein said supply voltage is drawn from an alternating current power bus, connected via inductive or capacitive coupling to said filter/regulator.

7. The system for measuring individual cell voltages as in claim 1, wherein said VSU further comprises optocouplers.

8. A method for measuring individual cell voltages of a group of cells belonging to a fuel cell stack, said group of cells being provided with terminals, said method comprising the steps of:
connecting a voltage scanning unit (VSU) to said group of cells,
providing a voltage reference signal to a first terminal of a first cell of said group of cells,
applying said voltage reference signal to a first input of an analog to digital converter, said analog to digital converter being comprised in said VSU and being fed by a supply voltage,
connecting consecutively a voltage signal from the other terminals of said group of cells to be measured to a second input of said analog to digital converter, said analog to digital converter thereby converting a signal derived from said signals at said first and said second input.

9. A method for measuring individual cell voltages as recited in claim 8, further comprising the steps of, in case a measured cell voltage signal exceeds a predetermined threshold, calculating the minimum, average and maximum voltage of said fuel cell stack and performing a correcting action based on said minimum, average and maximum voltage.

10. The system of claim 1, wherein the filter/regulator is configured to provide both the voltage reference signal and the supply voltage to the analog to digital converter.

11. The system of claim 1, wherein the analog to digital converter is configured for adding the signal applied to the first input and the signal applied to the second input to obtain the signal derived from said signals and is configured for analog to digital converting the derived signal.

12. A voltage scanning unit for measuring individual cell voltages of a fuel cell stack, the VSU arranged for being connected to a group of cells belonging to said fuel cell stack, said group of cells being provided with terminals, wherein the voltage scanning unit comprises:
   a filter/regulator providing a voltage reference signal output;
   a multiplexer; and
   an analog to digital converter having a negative power supply, a positive power supply, a first input and a second input, and configured to analog to digital converting a signal derived from a signal at the first input and a signal at the second input;
   wherein the voltage reference signal output is connected to the second input of the analog to digital converter and is configured to be connected to the terminal of the cell having the lowest voltage level of said group of cells, and wherein the multiplexer is configured to be connected to the other terminals of said group of cells for consecutively connecting the other terminals to the first input of the analog to digital converter.

13. The voltage scanning unit of claim 12, wherein the filter/regulator further provides a voltage supply output connected to the positive power supply of the analog to digital converter.

14. The voltage scanning unit of claim 13, wherein the filter/regulator is configured to draw power from an AC power bus.

15. The voltage scanning unit of claim 12, wherein the negative power supply is an electrical ground.

\* \* \* \* \*